United States Patent [19]

Oettinger et al.

[11] Patent Number: 4,970,392
[45] Date of Patent: Nov. 13, 1990

[54] STABLY EMITTING DEMOUNTABLE PHOTOELECTRON GENERATOR

[75] Inventors: Peter E. Oettinger, Acton; Timothy D. Howard, Georgetown; John J. Fronduto, Waltham, all of Mass.

[73] Assignee: Thermo Electron Corporation, Waltham, Mass.

[21] Appl. No.: 466,497

[22] Filed: Jan. 17, 1990

[51] Int. Cl.$^5$ .......................... H01J 27/02; H01J 40/20
[52] U.S. Cl. ................................ 250/423 P; 250/424; 250/492.2; 313/542
[58] Field of Search ............... 250/423 P, 424, 492.24, 250/492.2; 313/542

[56] References Cited

U.S. PATENT DOCUMENTS 4,460,831 7/1984 Oettinger et al. ............. 250/492.24
4,820,927 4/1989 Langner et al. ................. 250/492.2

OTHER PUBLICATIONS

Pierce et al., Rev. of Scientific Instruments 51(4), Apr. 1980, pp. 478–499.

*Primary Examiner*—Jack I. Berman
*Attorney, Agent, or Firm*—Lahive and Cockfield

[57] ABSTRACT

A new method and apparatus for providing a stable, temporally controllable high current density electron beam from a photocathode has been developed. A low level of cesium and, possibly a stabilizing gas, is supplied to the photoemitting surface while the electron beam is being generated, thereby replenishing cesium and possibly other ions lost from the emitting surface on a continual basis.

23 Claims, 3 Drawing Sheets

STABLY EMITTING DEMOUNTABLE PHOTOELECTRON GENERATOR

BACKGROUND OF THE INVENTION

The present invention relates to the production of high current density beams of electrons. More particularly, the present invention relates to an apparatus and method for extending the lifetime of a photoemissive electron beam generator and for providing temporally constant current production in the form of a high current density beam of electrons.

A prior art GaAs photoemissive electron beam generator is described in U.S. Pat. No. 4,460,831, issued July 17, 1984, entitled "Lase, Stimulated High Current Density Photoelectron Generator and Method of Manufacture," the disclosure of which is incorporated by reference. GaAs and other semiconductor photoemissive electron beam generators emit high current density beams of electrons in response to illumination by an appropriate laser or light-emitting diode. These beam generators are particularly suitable as electron sources for electron beam semiconductor lithography. Electron beam lithography systems can provide smaller feature size, and accordingly, greater feature density, on semiconductor chips than can be created with optical lithography systems. Present optical systems are limited to the production of features in the 0.8–1.0 $\mu$m range, while electron beam lithography has created features below 0.5 $\mu$m in width and is expected to provide features below 0.25 $\mu$m. Features of this size would provide a substantially improved chip density.

Photoemissive electron beam generators are also suitable for electron microscopes, especially for those employed to inspect the highly resolved features on the semiconductor chips just described. The high brightness of the beam, and its imagibility from a few tenths of a micron to one micron or more, will allow high speed inspection of densely packed chips.

In order for an electron beam lithography system to be commercially viable as a machine for production runs of semiconductor chips, it would ideally provide a throughput that is competitive with that of conventional optical lithography systems. Currently, commercial production rates of optical systems are in the range of 40 wafer levels per hour. To achieve these throughputs and provide the desired high feature resolution with an electron beam lithography system, its electron beam must be very bright, i.e., have an exceptionally high current density and relatively small electron energy spread. The beam brightness is particularly important for a high throughput in an electron beam lithography system because the desired pattern is written sequentially. In contrast, high wafer level per hour throughput is a consequence in optical lithography systems of projecting all the features of an entire pattern simultaneously onto the wafer. Another important requirement for electron beam lithography systems is that the performance of the beam generator must be stable over time. The high brightness beam must be maintained throughout a commercially acceptable time period (preferably many months) in order to maximize the operating time and wafer throughput and thereby justify the cost of the relatively expensive equipment.

A GaAs crystal may be used as the electron source in a photoemissive beam generator that provides a high brightness beam. Such a crystal emits electrons in response to irradiation by visible and near-infrared incident light beam following "cesium-activation" by the deposition of small amounts of cesium and oxygen or fluorine in a prescribed manner on it surface. The term "cesium-activation," as used herein, refers to this method of activation. A preferred photoemissive surface has a GaAs crystal with cesium and either oxygen or fluorine, e.g., from nitrogen trifluoride ($NF_3$), deposited thereon. In applications where such a semiconductor photoemitter or photocathode is sealed in a closed environment, such as in a image convertor tube, an equilibrium is established between the photosurface elements and the volume in the tube and its walls, whereby the rate of loss of activation elements from the photosurface is balanced by the arrival and redeposition of similar materials from the tube walls. Under these conditions, the resultant beam generator is relatively stable over time. However, in an application where this type of photocathode is used in an electron optical column which is constantly pumped to maintain a high vacuum, such as an electron beam lithography system, a deposition equilibrium is not established and the loss of activation elements from the photosurface is not balanced by redeposition This yields a net loss of the activation materials from the photoemissive surface, resulting in a degradation of the electron beam generating ability over time.

In order to counteract the degradation of a photoemissive surface in the non-equilibrium environments, it has been the practice of the prior art to periodically reactivate the photoemissive surface by first interrupting beam generation, redepositing cesium, and then restarting beam generation. See, e.g. previously cited U.S. Pat. No. 4,460,831. While the beam interruption required by this method is not a problem for some applications, it is commercially unacceptable in lithography systems where continuous operation and constant electron emission are required.

Accordingly, it is an object of the invention to provide an apparatus which provides a continuous stable high brightness emission of electrons over long periods, e.g., several months or more, from a semiconductor photoemissive electron beam generator.

Another object of the invention is to provide means for continual replenishment of cesium lost from a cesium-activated photoemissive surface of a photocathode.

A further object of the invention is to provide a method of reducing the desorption of activating elements from a photocathode surface.

These and other objects and features of the invention will be apparent from the following description and the drawings.

SUMMARY OF THE INVENTION

The present invention features a photoelectron generating apparatus which provides a high current density beam of electrons that may be controlled to be substantially constant in intensity over long periods of time and a method of providing a continual replenishing of the emitting surface to achieve this end. This apparatus and method can be used for a variety of purposes, including electron microscopy and electron beam lithography of semiconductor wafers.

The photoelectron generating apparatus of the present invention has a housing enclosing an interior region which has associated therewith means for establishing the evacuation of that region. Preferably, a substantial vacuum is created within the interior region.

A cesium-activated semiconductor photocathode, preferably a GaAs photoemitter, is positioned within the evacuated region. The photocathode has an excitation surface adapted to receive an applied excitation light beam and an electron emitting surface The electron emitting surface emits electrons in response to the incidence of the excitation beam on the excitation surface.

The photoelectron beam generating apparatus further includes a device for supplying a controllable vapor of atomic cesium to the electron emitting surface. This device is operative during times when the excitation beam is incident on the excitation surface. The vapor supplying device may be adjustably controlled such that the rate of supply of cesium to the emission surface can be controlled.

The photoelectron beam generating apparatus also may include a sensor for measuring the rate of electron emission from the surface. This sensor may be coupled in a feedback-type configuration whereby the device for adjustably controlling the rate of the supply of cesium vapor is responsive to the sensor such that the rate of the electron emission will substantially match a desired, preferably predetermined constant, rate. The cesium supply device is, preferably, a cesium "channel" having a mixture of cesium chromate, zirconium, and tungsten powders within an elongated enclosure and electrically resistive means for heating the powder. The channel, or tube has an opening positioned adjacent to and laterally displaced from the emitting surface of the photocathode. With this configuration, atomic cesium released from the channel is directed onto the emitting surface. A current driving mechanism is preferably included for the channel, which can maintain the temperature of the channel. A low current) e.g., about 1–2 amps, and a resulting low temperature, e.g., 300–400° C., is used, as compared with the 4–5 amps and 550–800° C. temperature normally used to operate a cesium channel. This allows deposition of controlled, limited amounts of cesium on the emitting surface. Cesium vapor pressures of approximately $10^{-12}$ torr at the deposition site are maintained during electron photoemission.

This continuous low rate flow of cesium onto the photoemissive surface replenishes the cesium lost due to backstreaming ion sputtering of the cathode and thermally-induced evaporation caused by absorption of the incident radiative beam. The cesium flow may come directly from the channel or oven, or indirectly from nearby surfaces onto which the cesium has been deposited and from which it desorbs. The low value of this replenishment flow of cesium is important since it does not interfere with the photoemitted electron beam which is flowing simultaneously. In the preferred embodiment described below, the cesium flow rate from the channel is so low, at the approximate 1–2 ampere driving current, that it is below the manufacturer's (SAES Company) specifications for operation. High flow of cesium would tend to degrade photoemission by excessively coating the cathode with this element. Moreover, collisions between cesium atoms and photoelectrons would increase sufficiently to degrade the electron beam. Furthermore, the cesium channel would be depleted in an unacceptably short time.

The preferred semiconductor for the photocathode is GaAs. With this material used as the base material of the photocathode, cesium-activation is obtained by alternately depositing cesium and either the gas oxygen ($O_2$) or fluorine ($F_2$) in the form, for example, of the gas nitrogen trifluoride ($NF_3$). Although it appears that the subsequent addition of small amounts of cesium alone achieves a high degree of long term stable electron emission, it may also be necessary to supply either of these gases concurrently with the addition of cesium.

In one embodiment, the oxygen supply includes a platinum wire coated with potassium chlorate positioned in the evacuated region adjacent the emission surface. A current is driven through this wire by an associated power supply to convert some of the potassium chlorate to potassium chloride, releasing oxygen. In another embodiment, a silver tube with a heater may be integrated into the vacuum housing. By heating the tube to approximately 700–800° C., oxygen passes from the atmosphere through the tube and into the evacuated region, thereby supplying the oxygen. If $NF_3$ is used, a gas supply and valve system leading into the housing may be used.

The invention further provides a method of producing a stable, temporally controllable high current density electron beam from a photocathode. This method uses a cesium activated semiconductor photocathode which emits electrons from an electron emitting surface upon photoactivation and a cesium source arranged to supply a replenishing flow of cesium to the emitting surface. Preferably, sources of oxygen and/or fluorine, e.g., $NF_3$, are also included to provide photoemitter stabilization. A high current density beam of electrons is generated from the photocathode in response to input illumination and a continual, low level flow of cesium is supplied to the photoemitting surface to keep the surface from degrading, thereby providing control of the electron beam. In some embodiments, a feedback loop may also be employed to keep the beam output constant. In such configurations, the flow rate of cesium is controlled in response to the sensed current established by the beam.

DETAILED DESCRIPTION OF THE INVENTION

The apparatus described herein provides a high current density, long term stable electron beam from a photocathode. Because of the small size of the photocathode and the ability to use injection lasers or light-emitting diodes as excitation sources, the apparatus is particularly well adapted for use in many applications, including either single or multiple electron beam lithography systems, and electron microscopes.

Figure 1A:
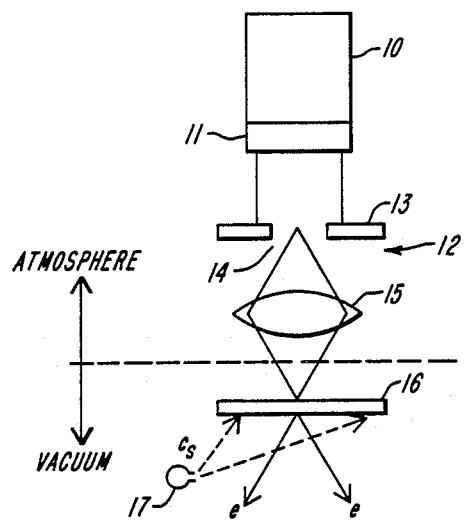
FIG. 1A and B provide schematic representations of the optical portions and electron-optical interfaces of an electron beam lithography system employing a photoemissive cathode such as is disclosed herein showing a focused and unfocused beam.
Figure 1B:
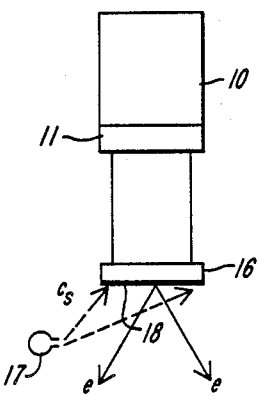

FIGS. 1A and 1B provide schematic representations of the optical portions and electron-optical interfaces of an electron beam lithography systems (for example, of the type in previously-cited U.S. Pat. No. 4,460,831) employing a back-illuminated, laser-irradiated photoemissive electron source according to embodiments of the invention. The systems include a light source 10, such as an argon ion laser, a semiconductor injection laser or a light emitting diode (LED). A preferred light source 10 is a current driven gallium aluminum arsenide (GaAlAs) injection laser emitting in the infrared region of the spectrum near a wavelength of 800 to 900 nm. The laser is used to irradiate a cesiated and oxygenated gallium arsenide photoemissive material, resulting in emitted electrons characterized by minimal energy spread. Since the injection laser is current-driven, modulation of its output beam is achieved by modulating the current input to the injection laser, rather than by means of a separate electro-optical or acousto-optical device.

In one form of the invention, the light beam radiating from the laser 10 is guided (as is shown in FIG. 1A) by a light optical train 12 including a plate 13 having an aperture 14 of specified geometry, for example, a square. A lens 15 focuses the laser light as an image of the aperture 14 onto a photoemissive cathode 16 which will be described in detail hereinafter. Alternatively (as is shown in FIG. 1B), the unfocussed laser beam irradiates the photoemissive cathode 16 which has been selectively masked, for example, by a predetermined pattern of deposited metal 18, such as molybdenum, established, for example, by optical lithographic means. Laser irradiation of regions with no metal deposition will cause those regions to photoemit electrons. In both embodiments, of FIGS. 1A and 1B, the photoemissive cathode 16 and electron optical components for processing the electrons emitted by the cathode 16 are housed within a vacuum chamber. A high vacuum such as a pressure of $10^{-9}$ torr or less is maintained in the vacuum chamber.

A cesium channel 17 located a few centimeters outside the photoemitted electron beam, but preferentially within line of sight of the photoemissive surface, supplies a flow of cesium directed onto the surface of photocathode 16. Relatively high cesium flow rates are used to activate the photocathode initially, and subsequently, relatively low cesium flow rates are used during photoemission to maintain a continuous cesium supply of the photocathode surface sufficient to maintain stable photoemission.

Although a cesium-activated gallium arsenide photocathode is the preferred photocathode, any cesium-activated semiconductor photocathode may be used. For example, cesium antimonide [$Cs_3Sb$], multialkali [$Na_2KSb$], and gallium phosphide [$GaP$](which do not require oxygen or fluoride), or gallium arsenide phosphide [$Ga(As_xP_{1-x})$] photocathodes may be used. Those skilled in the art will recognize other cesium-activated sources which may be used with the present invention.

Figure 2:
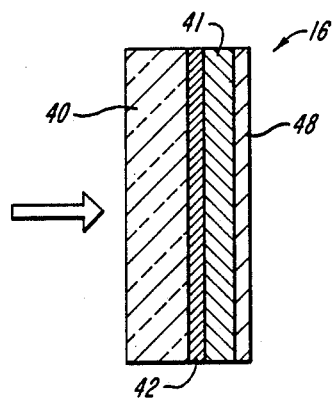
FIG. 2 is a cross-sectional side view of a photoemissive cathode such as is disclosed herein.

Back-illuminable photoemissive cathodes are preferred since they may be illuminated most easily from outside the evacuated region with all beam modulation being carried out outside of that region. FIG. 2 is a cross-sectional side view of a transmissive cesiated and oxygenated gallium arsenide photoemissive cathode. The photoemissive cathode 16 of FIG. 2 includes a light transmissive substrate 40 which is preferably a Corning glass 7056. A gallium aluminum arsenide layer 41 is bonded via silicon dioxide layer 42 to the glass substrate 40 and a photoemissive GaAs layer 48 is bonded to the layer 41. By way of example, layer 48 is approximately 2 $\mu$m thick. Before installation in the evacuated region, a thin portion of layer 48, e.g., several tenths of a micron, is etched away in order to remove contaminants. Subsequently, the photocathode exposure to oxygen and hydrocarbons is minimized and it is quickly placed into the vacuum enclosure in which it is to be used. The size of the electron emitting region in electron beam lithographic or microscopic systems is of the order of a few microns.

Figure 3:
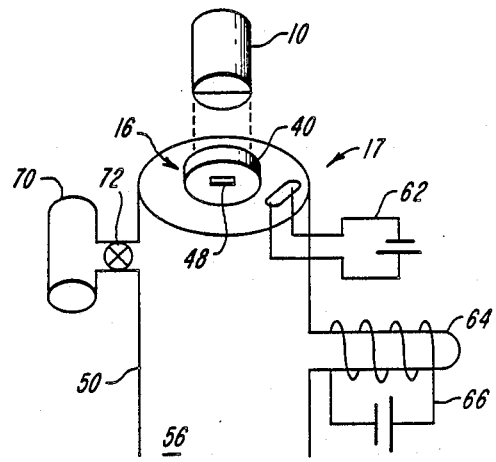
FIG. 3 is a schematic of the photoemissive cathode, showing cesium, oxygen, and nitrogen trifluoride sources for cesium-activation and replenishment.

FIG. 3 shows an embodiment of the invention including the photocathode 16, and cesium channel 17 positioned in an evacuated region 56 within a housing 50. A laser 10 is positioned external to the housing 50.

The cesium channel 17 contains cesium chromate powder and a reducing agent such as zirconium. In response to a drive current (applied by an exterior supply 62), the channel emits cesium in proximity to the surface of layer 48 of photocathode 16.

Suitable cesium channels are may be purchased, for example, from SAES Company as Model No. St101-Cs. Normally, these cesium channels, when used in the photoelectrode activation process, are heated to a high temperature (over 550° C.) which requires a current of about 4-5 amps. However, the present invention permits use of the channel at much lower drive currents (and thus much lower temperatures). More particularly, replenishment of the cesium-activated surface of layer 48 with cesium may be attained with the present configuration at a current value, e.g., of approximately 1.8 amps, which results in a channel temperature of only about 300° C. Under these conditions, the channel provides an equivalent cesium pressure of about $10^{-12}$ torr at the photoemissive cathode surface; a cesium level sufficient to maintain the surface if used substantially continually during photoemission without adversely interfering with the electron beam.

The housing 50 also includes a source for providing oxygen or fluorine to the photocathode 16. The preferred oxygen source includes a 3.25 mm outer diameter, 0.25 mm wall thickness, silver tube 64 extending approximately 6.3 cm outward from the sidewall of housing 50, together with an associated external heater 66 (including resistance-heating wire winding around tube 64) and a power supply. In practice, the heater 66 heats the tube 64 to a temperature of 700–800° C. At these temperatures, the silver is permeable to ambient oxygen and allows this gas into housing 50. Activation, for example, of a gallium arsenide photoelectrode, is performed at oxygen pressures of $10^{-8}$ to $10^{-6}$ torr. The oxygen is used in conjunction with cesium in a sequential, or "yo-yo," manner to activate, and maintain activated, a gallium arsenide or gallium arsenide phosphide photoemissive surface 48 on photocathode 16.

The fluorine source includes a nitrogen trifluoride tank 70 with a valve 72 extending through housing 50 to provide low pressure on the order of $10^{-9}$ to $10^{-8}$ torr of this gas into housing 50.

Normally, in operation either a fluorine source or oxygen source but not both, is present when a gallium arsenide or gallium arsenide phosphide photoemissive laYer 48 is the electron source.

In operation, a laser beam from laser 10 strikes the back of transparent glass 40 and passes through layer 41 to the proximal (excitation) surface of layer 48. The light then passes through the negative electron affinity region between the excitation surface of layer 48 and the distal (photoemissive) surface of that layer. As light passes through that region, electrons are generated, which in turn are emitted from the photoemissive surface 48 as an electron beam. The beam may be readily shaped and deflected by an electron optical train such as that shown, for example, in FIG. 1 of U.S. Pat. No. 4,460,831. As the electrons are released from photoemissive surface 48, primarily cesium and, apparently to a much smaller extent either fluorine or oxygen compounds are also released. This release is believed to be due to bombardment of surface 48 by backstreaming positive ions which cause thermal desorption of these species. The backstreaming ions are generated by photoelectrons, accelerated to high velocities, which collide with atoms deposited on various electron optical surfaces. The major such ion is cesium. In accordance with the invention, the cesium provided by the channel 17 (in response to the relatively low drive current) provides sufficient atomic cesium to replenish the photoemissive surface of layer 48 during photoemission without interfering with the generated electron beam. To the extent necessary, oxygen from tube 64 or nitrogen trifluoride from tank 70 are also used to replenish any oxygen or fluorine loss.

Cooling the photoemissive cathode also may be used to promote thermal stability of the electron source. This cooling reduces the thermal desorption of cesium from the photoemissive surface 48. Accordingly, an external cooling device (such as a thermoelectric cooler), a liquid cooling jacket, or some form of fin-type cooling device may be used advantageously either alone or simultaneously with cesium replenishment.

Figure 4:
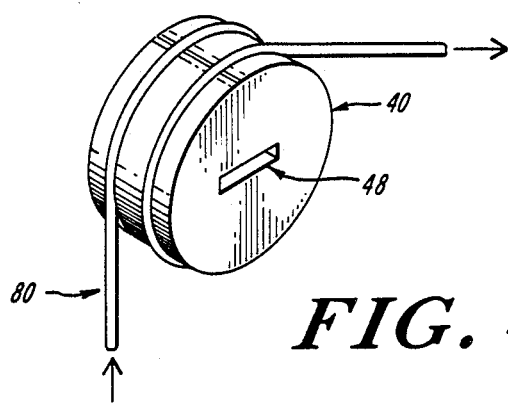
FIG. 4 is a schematic of a cooled photoemissive electron beam generator.

FIG. 4 illustrates an exemplary single cooling system for both substrate 40 and photoemissive surface layer 48. Cooling of the photocathode appears to decrease the loss of species from the photoemissive surface without modifying the beam intensity The cooling system shown is a coil of tubing 80 surrounding substrate 40. Tubing 80 is connected to a liquid, such as water, or a cold nitrogen vapor source (not shown) which provides cooling of substrate 40 and the resulting cooling of photoemissive surface 48.

Figure 5:
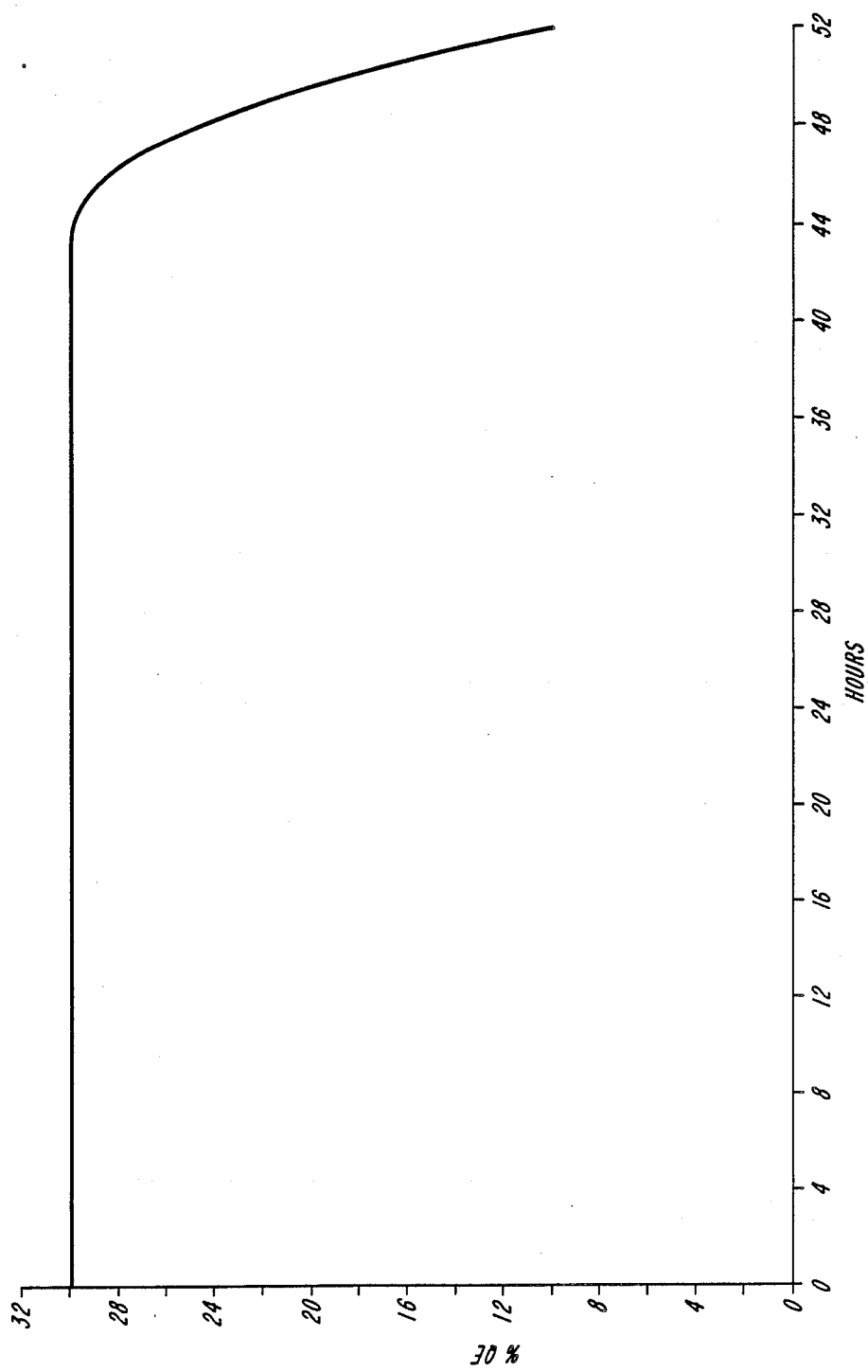
FIG. 5 is a graph of quantum efficiency versus time for a photocathode of the invention.

FIG. 5 illustrates the quantum efficiency as a function of time of a GaAs (Cs, F) photocathode irradiated by a constant gallium aluminum arsenide laser operating at a wavelength of 800 nm. The vertical axis shows the quantum efficiency in percent while the horizontal axis is in hours. During the first 44 hours, a maintenance dose of cesium from a resistance heated cesium channel (as taught by the present invention) was supplied to the photoemissive surface. The current drive of the channel was kept between 1.4 and 1.6 amperes to maintain a constant electron emission with only minor fluctuations. At 44 hours, the cesium source, in particular the resistance heating of the channel, was terminated. As is evident from FIG. 5, the quantum efficiency, which is directly related to the electron beam current, stayed at a constant level during the cesium maintenance and when the cesium flow from the channel stopped, the quantum efficiency dropped. This dramatic improvement in stability allows the photocathodes of the present invention to be used for long-term devices such as electron beam lithography systems or electron microscopes in an economically viable manner.

Figure 6:
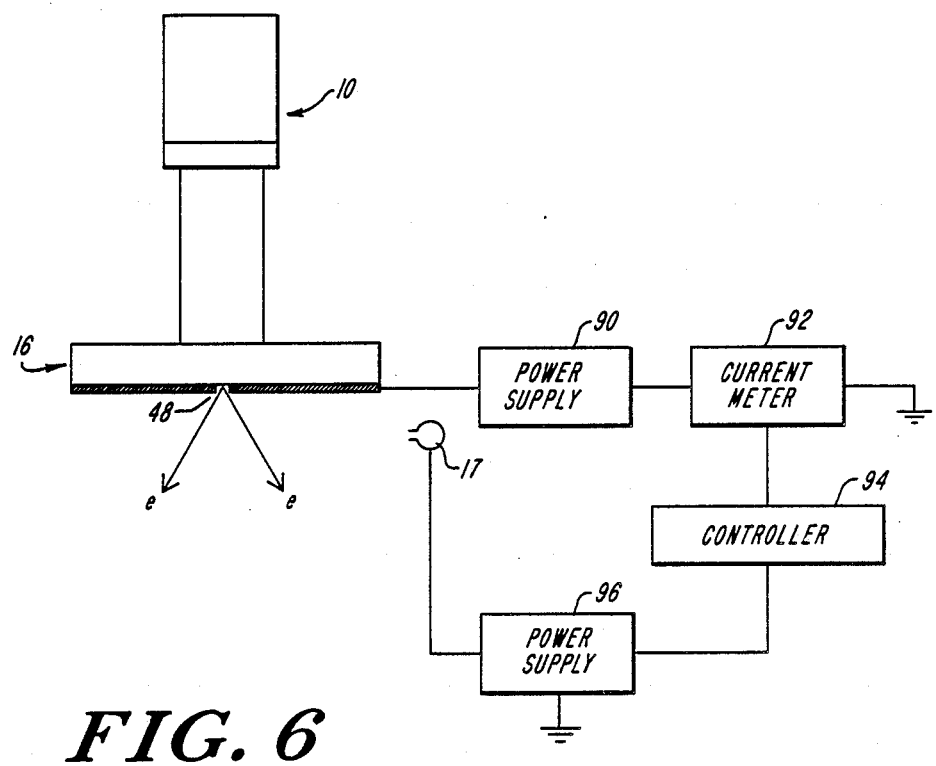
FIG. 6 is a schematic of a feedback network for controlling the rate of cesium deposition onto the photoemitting surface.

FIG. 6 shows a simple feedback mechanism to control the rate of cesium flow from a cesium channel by adjusting its drive current in accordance with the level of photoemitted current. This feedback system permits maintenance of a stable photocurrent. More particularly, power supply 90, current meter 92, and controller 94 provide a control circuit for measuring the photocurrent emitted by the photoemissive-surface 16. If there are variations in the photoemission, controller 94 adjusts the output drive current power supply 96 which correspondingly changes the resistive heating of cesium channel 17, thereby controlling the amount of cesium applied to photoemissive surface of photocathode 16. Since the cesium applied is directly related to the current of the electron beam, the feedback circuitry can provide a constant beam in terms of electron density over time.

Those skilled in the art may determine other modifications and variations of the disclosed invention. Such other modifications and variations are within the scope of the following claims.

What is claimed is:

1. A photoelectron generating apparatus comprising:
  A. a housing enclosing an interior region and an associated means for establishing and maintaining the evacuation of said region,
  B. a cesium-activated semiconductor photocathode positioned within said region, said photocathode having an excitation surface adapted to receive an applied excitation light beam and having an electron emitting surface from which electrons are emitted in response to the receipt of said excitation beam on said excitation surface, and
  C. means operative during times when said excitation beam is incident on said excitation surface for supplying a controllable vapor of atomic cesium to said electron emitting surface.

2. A photoelectron generating apparatus according to claim 1 further comprising means for adjustably controlling the rate of said supply of said cesium vapor to said electron emitting surface.

3. A photoelectron generating apparatus according to claim 1 further comprising means for measuring the rate of electron emission from said emitting surface.

4. A photoelectron generating apparatus according to claim 3 further comprising means for adjustably controlling the rate of said supply of said cesium vapor to said electron emitting surface, said rate controlling means being responsive to said measuring means whereby said rate of electron emission substantially matches a desired rate.

5. A photoelectron generating apparatus according to claim 4 wherein said desired rate is a predetermined constant.

6. A photoelectron generating apparatus according to claim 1 further comprising means for generating said excitation beam.

7. A photoelectron generating apparatus according to claim 6 wherein said generating means is selected from the group consisting of GaAlAs diode lasers and light emitting diodes.

8. A photoelectron generating apparatus according to claim 1 wherein said semiconductor is selected from the group consisting of gallium arsenide and gallium arsenide phosphide.

9. A photoelectron generating apparatus according to claim 8 wherein said emitting surface has previously been activated and stabilized in part by alternate depositions of cesium and fluorine.

10. A photoelectron generating apparatus according to claim 8 wherein said emitting surface has previously been activated and stabilized in part by alternate depositions of cesium and oxygen.

11. A photoelectron generating apparatus according to claim 1 wherein said cesium vapor supply means comprises a channel containing cesium chromate powder and an associated means for driving a current through said channel to heat it sufficiently to emit cesium.

12. A photoelectron generating apparatus according to claim 1 wherein said means for establishing and maintaining said vacuum includes means for establishing and maintaining a cesium vapor pressure approximately equal to about $10^{-12}$ torr in said portion of said region adjacent to said emitting surface of said photocathode.

13. A photoelectron generating apparatus according to claim 7 further comprising means operative during times when said excitation beam is incident on said excitation surface for supplying oxygen ($O_2$) to said electron emitting surface.

14. A photoelectron generating apparatus according to claim 13 wherein said oxygen supply means includes a platinum wire coated with potassium chlorate positioned in said interior region, and an associated means for driving a current through said coated wire whereby at least some of said potassium chlorate is converted to potassium chloride and oxygen is liberated.

15. A photoelectron generating apparatus according to claim 13 wherein said oxygen supply means includes a silver tube integrated into said housing, and means for heating said tube to a temperature in the approximate range 700-800 degrees Celsius whereby oxygen passes from outside said housing through said tube to said electron emitting surface.

16. A method of producing a stable, temporally controllable high current density electron beam from a photocathode comprising the steps of:

providing a cesium-activated semiconductor photocathode which emits electrons from an electron emitting surface upon photoactivation;

providing a cesium source arranged to supply a controllable flow of cesium to said electron emitting surface;

photoactivating said photocathode by applying a light input to cause said electron emitting surface to emit electrons in the form of a high current density electron beam; and applying a controlled, low level flow of cesium to said electron emitting surface while said electron beam is being emitted to replenish cesium lost during emission;

whereby the cesium activation of said electron emitting surface is maintained at a controllable level, thereby providing a stable, temporally controllable high current density electron beam.

17. The method of claim 16 further comprising the step of controlling the flow rate of said cesium during said emission of electrons whereby the rate of emitted electrons substantially match a desired rate.

18. The method of claim 16 further comprising the step of providing a controllable flow of a stabilizing gas to said electron emitting surface while said electron beam is being emitted.

19. The method of claim 18 wherein said stabilizing gas is selected from the group consisting of oxygen, fluorine, and nitrogen trifluoride.

20. The method of claim 17 wherein said control of said flow of cesium to said electron emitting surface is achieved by a feedback circuit.

21. The method of claim 20 wherein said feedback circuit senses the current output of said emitting electron beam and adjusts the amount of cesium supplied to said electron emitting surface to achieve a desired current value.

22. The method of claim 16 wherein said cesium activation is achieved by using a cesium channel as a cesium source.

23. The method of claim 16 further comprising the step of cooling said photocathode while said electron beam is being emitted.

* * * * *